United States Patent [19]

Criss

[11] Patent Number: 4,478,700
[45] Date of Patent: Oct. 23, 1984

[54] MAGNETIC SPUTTERING ANODE RECONDITIONING

[75] Inventor: Russell C. Criss, Pittsburgh, Pa.
[73] Assignee: PPG Industries, Inc., Pittsburgh, Pa.
[21] Appl. No.: 571,404
[22] Filed: Jan. 17, 1984
[51] Int. Cl.$^3$ .............................................. C23C 15/00
[52] U.S. Cl. ................................ 204/192 R; 204/298
[58] Field of Search ............... 204/192 R, 192 C, 298
[56] References Cited

U.S. PATENT DOCUMENTS

| | | | |
|---|---|---|---|
| 3,325,393 | 6/1967 | Darrow et al. | 204/192 EC |
| 4,166,018 | 8/1979 | Chapin | 204/192 R |
| 4,200,510 | 4/1980 | O'Connell et al. | 204/298 |
| 4,379,040 | 12/1982 | Gillery | 204/192 R |

OTHER PUBLICATIONS

Stern, IBM Tech. Disc. Bull., 12, (1969), p. 149.
Buchman et al., IBM Tech. Disc. Bull., 15, (1972), pp. 1818–1819.
Petuai et al., IBM Tech. Disc. Bull., 25, (1983), p. 6595.

Primary Examiner—Arthur P. Demers
Attorney, Agent, or Firm—Donna L. Seidel

[57] ABSTRACT

A method for reconditioning an anode which has lost effectiveness as a result of the deposition of a dielectric material in a cathode sputtering process is disclosed, whereby the effectiveness of the anode is restored by depositing a conductive material over the dielectric material which has been deposited on the anode.

8 Claims, No Drawings

MAGNETIC SPUTTERING ANODE RECONDITIONING

BACKGROUND

This invention relates generally to the art of cathode sputtering, and more particularly to the art of reconditioning the anode in a cathode sputtering apparatus.

U.S. Pat. No. 4,379,040 to Gillery describes a method and apparatus for the control of reactive sputtering deposition of oxide-containing films, including the steps of monitoring the deposition rate and total pressure of the system, and maintaining them at a constant level by adjusting the oxygen and argon input flow rates. Gillery discloses producing a transparent electroconductive article by sputtering an inner transparent film of titanium oxide onto a transparent substrate, depositing a transparent electroconductive metal film onto the inner titanium oxide film, and sputtering an outer transparent film of titanium oxide onto said electroconductive film.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface.

A problem associated with the cathode sputtering of dielectric films such as titanium oxide is that the coating material is incidentally deposited onto the anode in the sputtering system as well as onto the substrate. As dielectric coating material builds up on the anode surfaces, the bias voltage of the anode increases, the anode becomes increasingly less effective, and coating uniformity deteriorates substantially. As a result, in order to achieve a uniform coating, the anode must be periodically reconditioned by cleaning, i.e., physically removing the dielectric coating material contamination from the anode surface. This reconditioning procedure is time-consuming and costly as it requires discontinuing the sputtering process, and removing the anode from the coating apparatus to avoid contaminating the sputtering environment as the anode is cleaned.

SUMMARY OF THE INVENTION

The present invention provides a method for reconditioning an anode rendered ineffective by a coating of dielectric material without discontinuing the sputtering process, without removing the anode from the sputtering apparatus, and without even removing the dielectric coating material from the anode surface. The present invention involves reconditioning the inefficient anode by applying a layer of conductive material over the dielectric coating material. The layer of conductive material lowers the bias voltage of the anode and renders it as effective as a new, uncontaminated anode. The reconditioning method of the present invention may be repeated numerous times, although eventually the alternating dielectric and conductive layers will build up to an unacceptable thickness.

DETAILED DESCRIPTION OF THE PREFERRED EMBODIMENTS

In a conventional cathode sputtering process, a substrate is supported within a coating chamber in facing relationship with a cathode having a target surface of the material to be sputtered. A suitable chamber is described in U.S. Pat. No. 4,094,763, the disclosure of which is incorporated herein by reference, and a useful magnetron sputtering apparatus is described in U.S. Pat. No. 4,166,018. Preferred substrates in accordance with the present invention include glass, ceramics and plastics which are not detrimentally affected by the operating conditions of the coating process.

The cathode may be any of the conventional designs known in the sputtering art, connected with a source of electrical potential, and preferably is employed in combination with a magnetic field to enhance the sputtering process. The cathode target surface comprises a material to be sputtered to form a dielectric coating layer. Preferred materials include metals which are sputtered in a reactive atmosphere to form dielectric oxide or nitride layers, such as titanium, indium, tin, zirconium, chromium, vanadium and stainless steel.

The anode used in sputtering processes to produce an accelerating electric field adjacent the sputtering surface of the cathode for forming a glow discharge confined within the magnetic field is typically a metal bar, rod or strip positioned adjacent the cathode. Although anode configuration has been described in the prior art as unimportant, preferred anode designs in accordance with the present invention are those described in U.S. patent application Ser. No. 571,406, filed on even date herewith by Gillery and Criss and entitled, "Anode for Magnetic Sputtering Apparatus."

In operation, in accordance with the present invention, a dielectric coating is deposited by reactive sputtering as follows. A substrate is placed in a coating chamber which is evacuated to a pressure less than about $10^{-3}$ torr, preferably less than $10^{-4}$ torr. A selected atmosphere of reactive and inert gases, preferably oxygen and argon, is established in the chamber.

The cathode, having a target surface of the material to be sputtered, is preferably operated in a scanning mode over the substrate to be coated. The target metal is sputtered, reacts with the atmosphere in the chamber, and deposits a dielectric coating on the substrate surface. Coincidentally, dielectric coating material is scattered back from the substrate and deposited on the anode, increasing its bias voltage and decreasing its effectiveness. When the efficiency of the anode decreases to the point that reconditioning is desired, the anode is coated with a layer of conductive material in accordance with the present invention.

Conductive materials useful in accordance with the present invention include metals in general such as silver, gold, copper, tin, aluminum, indium, magnesium, platinum, titanium, vanadium, chromium, zirconium and so on. Preferred conductive materials are silver, indium and tin. While the conductive layers which restore anode efficiency in accordance with the present invention may be deposited by any conventional coating techniques, cathode sputtering is clearly preferred since it may be accomplished without interrupting the sputtering process, removing the anode from the chamber, or contaminating the sputtering environment.

In a most preferred embodiment of the present invention, transparent electroconductive coated articles are produced by coating a transparent substrate such as glass with a multiple layer coating comprising a conductive metallic layer such as silver deposited between inner and outer layers of a dielectric material such as titanium or indium oxides which are antireflective, as described in U.S. Pat. No. 4,379,040 to Gillery, the disclosure of whih is incorporated herein by reference.

In accordance with prior art practices involving multiple cathodes, each cathode was assembled with an anode. Either cathode/anode pairs were positioned in stationary sequence while a substrate was conveyed past them, or cathode/anode pairs were sequentially scanned over stationary substrates.

In accordance with the present invention, a cathode having a target surface of material which deposits a dielectric coating layer is activated. A dielectric coating layer is formed on the substrate, and coincidentally, dielectric material is deposited on the anode, increasing its bias voltage and lowering its efficiency. Then another cathode, having a target surface of material which deposits an electroconductive layer, is activated while using the same anode. An electroconductive coating layer is formed on the substrate, and electroconductive material is likewise deposited on the anode, decreasing its bias voltage and raising its efficiency. In a most preferred embodiment of the present invention, this reconditioning of the cathode is achieved in the normal course of the coating process by employing an anode which remains in place with respect to a rotating device which presents alternate cathodes in sequence. If the conductive layer deposited in the normal course of operation is not sufficient to entirely restore the efficiency of the anode, sputtering of the cathode producing the conductive layer can periodically be carried on longer. The reconditioning method of the present invention can be repeated numerous times, the only limitation being the eventual unacceptable thickness of the coating on the anode.

The present invention will be further understood from the descriptions of specific examples which follow.

EXAMPLE I

A titanium cathode is scanned over glass substrates in an atmosphere of 13 percent oxygen in argon at ambient temperature and pressure of about $10^{-3}$ torr to deposit a dielectric layer of titanium oxide on the glass surface. With an applied electric potential of 450 volts, the current supplied at 15 amps, and the scanning speed at 2 inches (5 centimeters) per minute, six passes of the cathode are required to deposit a titanium oxide film of the desired thickness, i.e. resulting in 73.5 percent luminous transmittance of the coated glass. The anode, with an initial bias voltage of about 5 volts, performs effectively as the bias voltage increases to about 25 volts over a period of about 30 minutes of titanium sputtering at this rate, after which the uniformity of the coating begins to deteriorate as the bias voltage of the anode continues to increase. The bias voltage of the anode is the voltage measured across a bias resistor, in this example 15 ohms, positioned between the anode side of the power supply and ground, in this example the chamber. To recondition the anode, the titanium cathode is replaced with a silver cathode while the anode remains in place. At 500 volts and 8 amps, silver is sputtered in an atmosphere of 100 percent argon at ambient temperature and a pressure of $10^{-3}$ torr. Sputtering silver for about one minute under these conditions is sufficient to reduce the bias voltage of the anode to about 5 volts and re-establish optimum performance. The reconditioning of the anode may be accomplished even more quickly by increasing the power to the cathode in order to increase the sputtering rate of silver.

EXAMPLE II

A multiple cathode sputtering system is assembled comprising a titanium cathode for depositing titanium oxide layers and a silver cathode for depositing a silver layer in a multilayer electroconductive, antireflecting coating on glass. The titanium cathode is scanned over a glass substrate in an atmosphere of 13 percent oxygen in argon at $10^{-3}$ torr and ambient temperature. Six passes of the cathode assembly at 2 inches (5 centimeters) per minute with the power at 450 volts and the current at 15 amps deposit sufficient titanium oxide to reduce the luminous transmittance of the coated glass to about 73.5 percent as in Example I. The bias voltage of the anode increases to about 20 volts. A rotating device in the cathode assembly replaces the titanium cathode with silver, while the anode remains in the same position. With the power at 500 volts, current at 8 amps, sputtering in 100 percent argon and scanning at 5.2 inches (13.2 centimeters) per minute, sufficient silver is deposited in oen pass to decrease the luminous transmittance of the glass to 60 percent, and reduce the bias voltage of the anode to about 9 volts. The silver cathode is replaced with titanium, and titanium oxide is again deposited as described above. Nine passes deposit sufficient titanium oxide to produce an electroconductive coated article having a luminous transmittance of 79 percent. The bias voltage of the anode increases to about 23 volts, still within the range for producing uniform coatings. If additional reconditioning of the anode is required, it can be accomplished by sputtering silver when the cathode is not scanning over the product to be produced.

The above examples are offered to illustrate the present invention which may be practiced with cathodes and anodes of various materials and configurations. Reconditioning of the anode can be accomplished by depositing a conductive coating by means other than sputtering. Although bias voltage of the anode is a convenient indicator of anode condition, various other indicators such as coating deposition rate may be employed. The scope of the present invention is defined by the following claims.

I claim:

1. In a method of depositing dielectric coatings by cathode sputtering wherein the anode loses effectiveness as it becomes coated with dielectric material, the improvement which comprises depositing a conductive material over the dielectric coating on the anode.

2. The improved method according to claim 1, wherein the dielectric material is selected from the group consisting of the oxides and nitrides of titanium, tin, indium, zirconium, chromium, vanadium and stainless steel.

3. The improved method according to claim 2, wherein the dielectric material is titanium oxide.

4. The improved method according to claim 1, wherein the conductive material is a metal selected from the group consisting of silver, gold, copper, tin, aluminum, magnesium, platinum, titanium, indium, zirconium, chromium, vanadium and palladium.

5. The improved method according to claim 4, wherein the conductive material is silver.

6. The improved method according to claim 5, wherein the conductive material is deposited by cathode sputtering.

7. The improved method according to claim 1, wherein the effectiveness of the anode is evaluated by measuring the bias voltage.

8. The improved method according to claim 7, wherein the anode effectiveness is restored by depositing conductive material until the bias voltage approaches the bias voltage of an anode free from dielectric coating material.

* * * * *